US012802933B2

(12) United States Patent
Posseme et al.

(10) Patent No.: US 12,802,933 B2
(45) Date of Patent: Nov. 17, 2026

(54) METHOD FOR PLASMA ETCHING A LAYER BASED ON A III-N MATERIAL

(71) Applicants: COMMISSARIAT A L'ENERGIE ATOMIQUE ET AUX ENERGIES ALTERNATIVES, Paris (FR); LAM RESEARCH CORPORATION, Fremont, CA (US)

(72) Inventors: Nicolas Posseme, Grenoble Cedex (FR); Simon Ruel, Grenoble Cedex (FR); Patricia Pimenta Barros, Grenoble Cedex (FR); Bryan Helmer, Fremont, CA (US); Philippe Thoueille, Fremont, CA (US)

(73) Assignees: COMMISSARIAT A L'ENERGIE ATOMIQUE ET AUX ENERGIES ALTERNATIVES, Paris (FR); LAM RESEARCH CORPORATION, Fremont, CA (US)

( * ) Notice: Subject to any disclaimer, the term of this patent is extended or adjusted under 35 U.S.C. 154(b) by 346 days.

(21) Appl. No.: 18/711,753

(22) PCT Filed: Nov. 22, 2022

(86) PCT No.: PCT/EP2022/082828
§ 371 (c)(1),
(2) Date: May 20, 2024

(87) PCT Pub. No.: WO2023/094387
PCT Pub. Date: Jun. 1, 2023

(65) Prior Publication Data
US 2025/0079122 A1 Mar. 6, 2025

(30) Foreign Application Priority Data
Nov. 29, 2021 (EP) .................................... 21315254

(51) Int. Cl.
*H01J 37/32* (2006.01)
*H10P 50/24* (2026.01)

(52) U.S. Cl.
CPC .. *H01J 37/32146* (2013.01); *H01J 37/32816* (2013.01); *H10P 50/242* (2026.01); *H01J 2237/334* (2013.01)

(58) Field of Classification Search
None
See application file for complete search history.

(56) References Cited

U.S. PATENT DOCUMENTS

| | | | |
|---|---|---|---|
| 10,535,748 | B2 | 1/2020 | Cheng et al. |
| 11,581,184 | B2 | 2/2023 | Posseme et al. |

(Continued)

FOREIGN PATENT DOCUMENTS

| | | | |
|---|---|---|---|
| CN | 113206042 A | 8/2021 | |
| EP | 3 023 799 A1 | 5/2016 | |

(Continued)

OTHER PUBLICATIONS

International Search Report and Written Opinion mailed Feb. 17, 2023 in PCT/EP2022/082828 filed on Nov. 22, 2022, 9 pages.

*Primary Examiner* — Roberts P Culbert
(74) *Attorney, Agent, or Firm* — Oblon, McClelland, Maier & Neustadt, L.L.P.

(57) ABSTRACT

A method for etching at least a portion of a layer based on a III-N material includes exposing a least one portion of an upper face of the III-N layer to a plasma treatment with bias voltage pulsing based on chlorine, wherein the plasma treatment is configured to present a duty cycle comprised between 20% and 80%. A first non-zero polarization bias is applied to the substrate during Ton, and a second polarization bias lesser than the first non-zero polarization bias or no polarization bias is applied, during Toff, so as to etch the portion of the III-N layer. The duration of the etching is (Continued)

significantly reduced to obtain a satisfying quality of the III-N layer for the operation of a microelectronic device, such as a transistor or a diode.

20 Claims, 8 Drawing Sheets

(56) References Cited

U.S. PATENT DOCUMENTS

| | | | |
|---|---|---|---|
| 2010/0227372 | A1 | 9/2010 | Bilek et al. |
| 2013/0099277 | A1* | 4/2013 | Speck .............. H10H 20/01335 257/101 |
| 2014/0256149 | A1 | 9/2014 | Ranjan et al. |
| 2018/0090334 | A1 | 3/2018 | Tan et al. |
| 2020/0411718 | A1 | 12/2020 | Higashihara et al. |
| 2023/0101838 | A1 | 3/2023 | Hsieh et al. |

FOREIGN PATENT DOCUMENTS

| | | | |
|---|---|---|---|
| JP | 2003-124188 | A | 4/2003 |
| WO | WO 2021/255381 | A1 | 12/2021 |

* cited by examiner

METHOD FOR PLASMA ETCHING A LAYER BASED ON A III-N MATERIAL

DOMAIN OF THE INVENTION

The present invention relates in general to the integration of layers based on III-N materials such as gallium nitride (GaN) and aluminum gallium nitride (AlGaN), and their derivatives, within microelectronic devices. Its advantageous application is the production of devices such as transistors or diodes integrating one or more layers of III-N materials.

TECHNOLOGICAL BACKGROUND

The drive to reduce energy waste and increasing demand is driving microelectronic device manufacturers to improve the efficiency and performance of their electrical power conversion systems. Currently, conversion circuits are made from silicon and much research has been carried out to evolve the architectures in order to improve efficiency and conductivity. However, these devices are reaching the theoretical limits of silicon and new solutions must be developed.

Thanks to its electrical properties allowing the formation of a two-dimensional electron gas, the AlGaN/GaN heterostructure, formed by a layer of aluminum gallium nitride on a layer of gallium nitride, has good prospects for the development of power electronics or the development of diodes. It competes with Si and SiC in terms of device size, voltage handling, carrier mobility and series resistance.

Nevertheless, the practical use of this AlGaN/GaN heterostructure in devices such as a transistor or a diode, poses major issues that need to be tackled in order to exploit the full performance of these GaN-based materials. More generally, these issues arise for III-V materials and in particular III-N materials. In particular, it has been identified that the etch steps for device structuring are critical and degrade the electrical properties of the channel.

These etch steps concern, for example, the opening of a passivation layer on top of the AlGaN/GaN heterostructure in order to form the contacts of a diode, or to form the gate or contacts for transistors, for example HEMTs (High Electron Mobility Transistor).

AlGaN and GaN etching is generally carried out by plasma etching with chlorinated chemistries in an inductively-coupled plasma (ICP) reactor.

These solutions have many drawbacks. In particular, ion bombardment during plasma etching generally leads to a degradation of the materials of the layers and patterns that are to be retained. In addition, the control of the etch depth, carried out in time in the absence of a stop layer, requires stable process performance to achieve a precise target depth.

All of these drawbacks lead to degradation of the III-N layer and reduce the performance of the device.

Cyclic etching techniques have been proposed to limit these drawbacks. For example, Atomic Layer Etching (ALE) cycles for etching a GaN layer are comprised of the following two steps, successively repeated:

- a first self-limiting step to chlorinate the GaN layer using a $Cl_2$ and $BCl_3$ plasma treatment, chemically modifying the top portion of the GaN that will be etched,
- a second subsequent step of etching this chlorinated portion selectively with respect to the unmodified GaN, by an Ar-based plasma with a small bias voltage applied to the substrate, typically inferior to 90 V in absolute value.

While this technique improves the control of the etched thickness and reduces surface damage, it has the disadvantage of requiring a long processing time, which is not compatible with the industrial requirements in terms of productivity.

It is therefore an object of the present invention to propose a solution, which makes it possible to etch a III-N material layer, such as GaN or AlGaN, limiting or even eliminating the disadvantages of these known solutions. In particular, one objective is to reduce the duration of etching a III-N layer while limiting damage to the III-N layer.

Other objects, features and advantages of the present invention will become apparent from the following description and accompanying drawings. It is understood that other advantages may be incorporated.

SUMMARY

To achieve this objective, according to one embodiment the present invention provides for a method for etching at least a portion of a layer based on a III-N material, comprising:

- providing a substrate comprising at least one layer based on a III-N material, called "III-N layer", presenting an upper face,
- performing at least one etching cycle comprising exposing a least one portion of the upper face to a plasma treatment based on chlorine with a plasma potential Vplasma, wherein the plasma treatment is with a bias voltage pulsing and is configured to present a duty cycle DC=Ton/(Ton+Toff) comprised between 10% and 80%, and wherein:
  - during at least a part of Ton timeframes, a first non-zero bias voltage called Vbias-substrate1 is applied to the substrate, preferably the first Vbias-substrate 1 has an absolute value |Vbias-substrate1| greater than or equal to 100V,
  - during Toff timeframes, a second bias voltage called Vbias-substrate2 is applied to the substrate, wherein the Vbias-substrate2 has an absolute value |Vbias-substrate2| lesser than |Vbias-substrate1|, or no bias voltage is applied to the substrate,
  - Vbias-substrate1 and Vbias-substrate2 being independent from Vplasma, so as to etch the portion of the III-N layer extending from the portion of the upper face.

With this method, the chlorination of the III-N layer and the plasma treatment are simultaneously performed in order to etch the III-N layer. During Ton, the etch of the III-N layer combines the chlorination of the III-N layer and the ion bombardment on the III-N layer. During Toff, the ion bombardment on the upper face is reduced and preferentially there is no significant bombardment on the upper face of the III-N layer. This value of bias voltage applied to the substrate increases the etching rate of the III-N layer. The pulsed Vbias-substrate allows meanwhile to decrease the average energy of ion bombardment on the III-N layer, thus reducing the damages that could occur. Synergistically, the duration of the etching is significantly reduced compared to pure ALE cycles, to obtain a a satisfying quality of the III-N layer for the operation of a microelectronic device, such as a transistor or a diode.

Methods disclosed in the present disclosure have shown superior results compared to the known ALE techniques. The sequence of cycles in embodiments of the present disclosure allows the substrate surface to be modified to a certain depth during the chlorination and then removing selectively the modified layer without impacting the underlying material by the Argon based plasma treatment. To achieve this, the energy applied during the Ar-plasma treatment must be carefully chosen.

FIG. 1 shows the etched quantity per cycle (EPC), as a function of the removal energy E, e.g. the ion energy, for an ALE cycle. As illustrated for example in FIG. 1, different energy regimes are observed. In regime I, the bombardment energy is insufficient to completely remove the modified layer. The removal is therefore partial. The energy is also too low to pulverize the underlying unmodified material and therefore does not cause degradation. In regime II, the bombardment energy is sufficient to remove the entire modified layer. The removal is therefore complete and the thickness removed per cycle corresponds to the thickness modified during the first stage. But, the ion energy is still too low to damage the underlying unmodified material, so the removal step is selective and self-limiting. The third regime corresponds to the energy range where the bombardment is energetic enough to pulverize the unmodified material. In this range, the removal of the modified layer is complete but the underlying material is also damaged. The removal step is therefore no longer selective. In addition, as the energy E increases too much, the materials would undergo further degradation, which changes the electrical properties.

It is therefore clear that, in order to achieve the desired quality for the underlying material with ALE cycles, the energy level must be carefully controlled to ensure it is high enough to remove the modified layer but also low enough to avoid damaging the unmodified III-N layer. The energy window is therefore narrow, which then leads to longer period of etch time. Overall, the etching duration for using just ALE alone is too long for practical industrial production.

Embodiments of the present disclosure resolved this issue by limiting the average energy of the ions by applying a pulsed bias voltage to the substrate. Each ion can therefore have an energy high enough to increase the etching rate of the III-N layer, partly due to the polarization bias voltage applied to the substrate, and the average ion bombardment energy can also be limited. In addition to the increased etch rate, the damage to the material layer is limited.

The average energy of ions can furthermore be limited in accordance with the duty cycle of the plasma treatment. During the development of the invention, it was found that a duty cycle between 10% and 80% corresponds to a range for which a sufficiently good compromise is found between the performances of the microelectronic device comprising the etched III-N layer, and the industrial requirements in terms of productivity, more especially the duration of the etching of the III-N layer.

This method is completely different from existing solutions using a plasma whose source is operated in a pulsed manner. A plasma treatment with source pulsing will lower the electron temperature in the plasma, with a constant ion bombardment. A plasma treatment with a pulsing of the bias voltage applied to the substrate allows modulating the ion bombardment on the upper face of the III-N layer.

BRIEF DESCRIPTION OF THE FIGURES

The aims, objects, features and advantages of the invention will become clearer from the detailed description of an embodiment of the invention which is illustrated by the following accompanying drawings.

Figure 1:
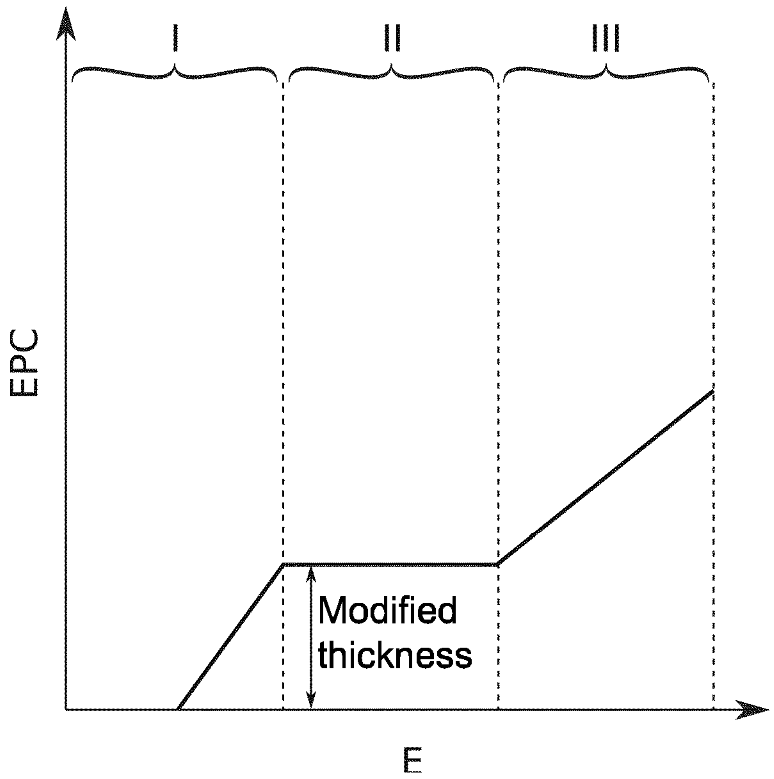
FIG. 1 illustrates the three energy regime in an ALE cycle.

The figures are given as examples and are not restrictive to the invention. They are principle schematic representations intended to facilitate the understanding of the invention and are thus not necessarily at the same scale as the practical applications. More particularly, the relative thicknesses of the various layers and films are not representative of reality.

DETAILED DESCRIPTION

Before describing a detailed review of embodiments of the invention, the following are optional features which may be used in combination or alternatively.

According to some embodiments, |Vbias-substrate1| applied is between 20V and 800V, preferably between 100 V and 800 V, preferably between 100 V and 500 V. In some embodiments, |Vbias-substrate1| applied is between 20V and 350V, preferably between 150 V and 350V, during at least a part of Ton timeframes, preferably for all Ton timeframes of at least one etching cycle. These Vbias-substrate values allow a more efficient etching while maintaining a good surface quality of the III-N layer, and are suitable for industrial production use.

According to an example, |Vbias-substrate2| is essentially lesser than or equal to 0.5*|Vbias-subtrate1|, preferably essentially lesser than 0.2*|Vbias-subtrate1|.

According to an example, |Vbias-substrate1|>2*|Vbias-substrate2|, preferably Vbias-substrate1|>5*|Vbias-substrate2|, and more preferably |Vbias-substrate1|>10*|Vbias-substrate2|, during at least a part of Ton timeframes, preferably for all Ton timeframes of at least one etching cycle.

According to an example, the duty cycle is comprised between 20% and 70%. In some embodiments, the duty cycle is about 50%. Control of the duty cycle percentages further improves the compromise between the performances of the microelectronic device comprising the etched III-N layer, and the industrial requirements in terms of productivity, more especially the duration of the etching of the III-N layer.

According to an example, the at least one etching cycle present a duration so that the etched portion of the at least one III-N layer present a thickness comprised between 20 nm and 3 μm, especially when the substrate is implemented in a transistor, for example a HEMT.

According to an example, the at least one etching cycle present a duration so that the etched portion of the at least one III-N layer present a thickness comprised between 100 nm and 5 μm, especially when the substrate is implemented in a LED, for example a μm-LED.

When the method comprises multiple etching cycles, the total duration of all cycles, that is to say the sum of the duration of each cycle, is chosen so that the etched portion of the at least one III-N layer present the thickness given above.

According to an example, the plasma treatment with pulsing of the bias voltage applied to substrate is configured to present a frequency F=1/(Ton+Toff). In some embodiments, the frequency F is between 100 Hz and 5 kHz, preferably between 150 Hz and 1 kHz. In some embodiments, the frequency F is set according to the range above to accommodate certain recipe or equipment constraints.

In some embodiments, the etching method may comprise multiple etching cycles, wherein |Vbias-substrate1| is different between the etching cycles. In some embodiments, |Vbias-substrate1| of at least one etching cycle is strictly less than |Vbias-substrate1| of one preceding etching cycle. The etching rate can be enhanced compared to existing ALE solutions especially for the top of the III-N layer when |Vbias-substrate1| applied is greater than 100 V. Also, decreasing Vbias-substrate as the multiple cycles go on reduces further damage to the III-N layer the closer one gets to the desired etching level.

According to this example, the plasma may be based on the same chemical compound between the several etching cycles. For all the etching cycle, the plasma may be based on $Cl_2$, preferentially in combination with $BCl_3$.

According to an example, |Vbias-substrate1| is essentially less than or equal to 100V during at least some other cycles within the group of all multiple cycles. The damages possibly induced on the III-N layer are further limited.

According to an example, the method comprises, prior to the at least one etching cycle, a prior etching cycle of the portion of the III-N layer comprising:

- exposing the least one portion of the upper face to a plasma treatment based on chlorine with a plasma potential Vplasma,
- during said plasma treatment, applying a non-zero bias voltage Vbias-substrate to the substrate, preferably non-pulsed, Vbias-substrate being independent from Vplasma and preferentially |Vbias-substrate| being greater than or equal to 100V during at least a part of the prior etching cycle.

A plasma treatment with a non-pulsed bias voltage applied to the substrate is faster than a plasma treatment with bias pulsing, but more damaging for the etched layer. This can be particularly useful for etching a thick portion the III-N layer, where a fast first etching step can be used to etch the majority of the layer, and the etching can be finalized by limiting the damages on the III-N layer. According to an example, prior to the at least one etching cycle, the upper face of the III-N layer is covered by a mask.

According to one example, a source of the plasma presents a power comprised between 100 W and 2000 W, preferentially between 300 W and 1000 W.

According to an example, the plasma treatment with bias pulsing is performed in a reaction chamber, and a pressure inside the reaction chamber is lesser than 250 mTorr, preferentially lesser than 90 mTorr, for instance comprised between 2 mTorr and 250 mTorr, in some instances between 2 and 90 mTorr, in some instances between 2 mTorr and 20 mTorr, during the at least one etching cycle. The pressure affects the residence time of the species and the directionality of the ions. A pressure of less than 90 mTorr limits the risk of ion deflection, and therefore improves the uniformity of the etched surface. With a pressure of less than 20 mTorr, the plasma is more ionized. The effects of the plasma treatment with a bias voltage pulsing are enhanced compared to using a higher pressure.

According to an example, the plasma treatment with bias pulsing is performed in a reaction chamber, a temperature of the reaction chamber, and more particularly of the chamber walls and/or the sample holder (equivalently the substrate temperature), is between 20° C. and 80° C. In some instances, the temperature of the reaction chamber is between 30° C. and 60° C. during the at least one etching cycle. The temperature affects the sticking coefficient of the species and the kinetic reaction rate during the etching. This temperature range improves the etching rate of the III-N layer.

According to an example, the plasma treatment with a bias pulsing is based on $Cl_2$, preferentially in combination with $BCl_3$. The etching of the III-N layer is mainly due to the presence of chlorine radicals, and is facilitated by the ion bombardment. $Cl_2$ is sufficient to etch III-N material with the exception of oxides. $BCl_3$ provides furthermore less reactive chlorine compared to $Cl_2$ and is able to etch oxides. Its role is to etch any surface oxides that may act as a micro-mask during chlorine etching and would increase roughness, and to trap the traces of oxygen contained in the plasma so that the oxidation of the surface being etched is limited.

According to another example, the plasma treatment with a bias pulsing is based on $BCl_3$, preferentially in combination with $Cl_2$. As stated above, $BCl_3$ facilitates the etching of the III-N layer and avoids increasing its roughness. According to an example, the III-N material comprises a chemical element selected from the group consisting of aluminum and gallium, for example the III-N material is selected from the group consisting of AlGaN, GaN, AlN, InGaN, AlInGaN.

According to an example, the substrate is integrated into a transistor for power electronic, such as a HEMT transistor.

According to an example, the substrate is integrated into a light emitting diode.

According to one example, the plasma treatment with bias pulsing is free of fluorine during at least one etching cycle, preferentially during all the etching cycles.

According to one example, the plasma power source is activated during essentially all the etching cycle(s). Equivalently, the plasma power source is not pulsed.

For the purposes of the present invention, the thickness of a layer is measured in a direction perpendicular to the surface along which the layer has its maximum extension. In the figures, the thickness is measured vertically. Similarly, when it is indicated that two elements are located in line with each other, this means that these two elements are both located on the same line perpendicular to the main plane of extension of the layer, i.e. on the same line oriented vertically in the figures.

It is clarified that, in the context of the present invention, the terms "on", "over", "covers", "underlying", "facing" and their equivalents do not necessarily mean "in contact with". Thus, for example, the deposition, transfer, bonding, assembly or application of a first layer to a second layer does not necessarily mean that the two layers are directly in contact with each other, but means that the first layer at least partially overlies the second layer by being either directly in contact therewith or by being separated therefrom by at least one other layer or at least one other element.

A III-N material is a material comprising at least one chemical element of the III column of the periodic table and nitrogen (N).

A substrate, film, layer, "based on" a material A, means a substrate, film, layer comprising that material A only or the material A and optionally other materials. Thus, in the present description, a layer based on a III-N material may be a layer consisting exclusively of a III-N material or a layer comprising a III-N material and other elements.

According to one example, in the context of the present invention a layer based on a III-N material is a GaN or AlN based material, for example AlGaN (or $Al_xGa_{(1-x)}N$, where x is between 0 and 1), GaN, AlN, InGaN, AlInGaN.

A GaN-based layer may be a layer consisting exclusively of GaN. Alternatively, it may consist of GaN and one or more elements from column Ill or column V of the periodic table of the elements, typically this may be a layer of AlGaN, InGaN or AlInGaN, or even other elements, which are for example unintentionally present and which may possibly originate from unwanted implantation.

According to one example the III-N material layer is doped. The doping can be performed with at least one of the following species: Mg, Si, P, O, Ca, C.

A layer may also be composed of several sub-layers of the same or different materials. Thus, a layer based on a III-N material may comprise a stack of several layers based on one or different III-N materials. In particular, a GaN-based layer may be a stack of GaN-based layers. For example, the stack may comprise an AlGaN layer located on, preferably directly in contact with, a layer made of GaN.

The term "dielectric" refers to a material whose electrical conductivity is sufficiently low in the given application to serve as an electrical insulator.

When expressing a gas mixture with percentages, these percentages correspond to fractions of the total flow rate of the gases injected into the reactor. Thus, if a gas mixture, for example intended to form a plasma, comprises x % of gas A, this means that the injection rate of gas A corresponds to x % of the total flow rate of the gases injected into the reactor to form the plasma.

Microelectronic device means any type of device made with microelectronic means. These devices include, in particular, in addition to purely electronic devices, micromechanical or electromechanical devices (MEMS, NEMS, etc.) as well as optical or optoelectronic devices (MOEMS, LED, etc.).

It may be a device intended to perform an electronic, optical or mechanical function, etc. It may also be an intermediate product intended for the production of another microelectronic device.

In the present invention, "HEMT" are high electron mobility field effect transistors, sometimes also referred to as heterostructure field effect transistors. Such a transistor includes the superposition of two semiconductor layers with different band gaps that form a quantum well at their interface. Electrons are confined in this quantum well to form a two-dimensional electron gas. For reasons of high voltage and temperature performance, the materials of these transistors are chosen to have a wide energy band gap.

The term "step" does not necessarily mean that the actions taken during a step are simultaneous or immediately successive, unless stated otherwise. In particular, some actions of a first step may be followed by actions related to a different step, and other actions of the first step may be repeated afterwards. Thus, the term step does not necessarily mean unitary and inseparable actions in time and in the sequence of the method phases.

A parameter "substantially equal to/less than/greater than" a given value is defined as being equal to/less than/greater than the given value within plus or minus 10% of that value. A parameter "substantially between" two given values means that the parameter is at least equal to the smaller given value within plus or minus 10% of that value and at most equal to the larger given value within plus or minus 10% of that value.

The method is hereafter described according to particular embodiments in reference to the FIGS. 2 to 7.

Figure 2:
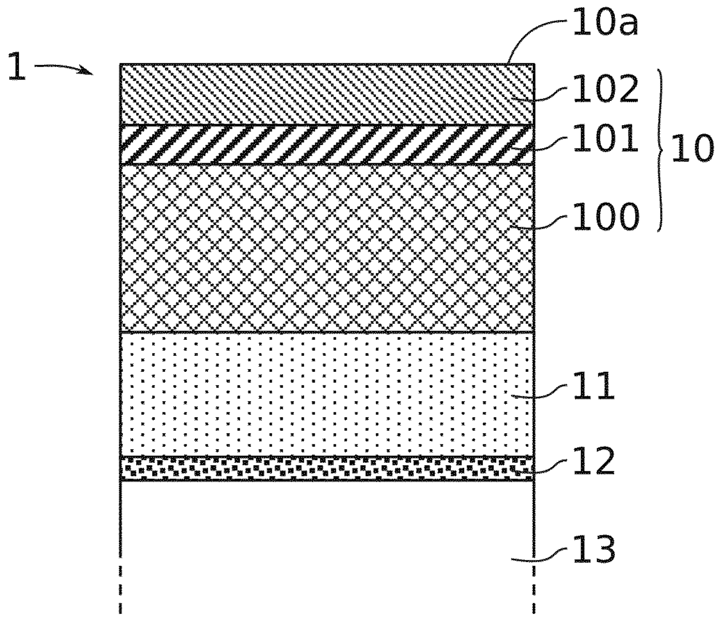
FIG. 2 illustrates a cross-sectional view of a substrate comprising a III-N layer, according to one example.

A preliminary step is to provide a substrate 1 comprising a layer 10 based on at least one III-N material, as shown for example in FIG. 2. Typically, this material is based on GaN. This layer 100 can be formed of a single layer. It can also be formed of a stack of layers 100, 101, 102, as described further below. The layer 100 may rest on other layers, typically a support 13 or growth substrate (not shown in FIGS. 3 to 6). An intermediate layer or layers 11, 12 may be disposed between the support layer 13 and the layer 10. According to one embodiment, the III-N layer 10 is intended to form the active layer of a transistor. Thus, the substrate 1 comprising the III-N layer 10 may be either a stack in which the III-N layer is one of the deposited layers on a support layer 13, or a stack comprising only the III-N layer. In this case, the layer can be self-supporting, i.e. it supports its own weight.

According to an example, in order to etch only a certain portion 10*c* (as illustrated for example in FIG. 5A) or several separate portions 10*c* of the layer 10, a mask 14 can be deposited covering the layer 10. However, the presence of this mask 14 is not mandatory to implement the steps described hereafter.

Figure 3:
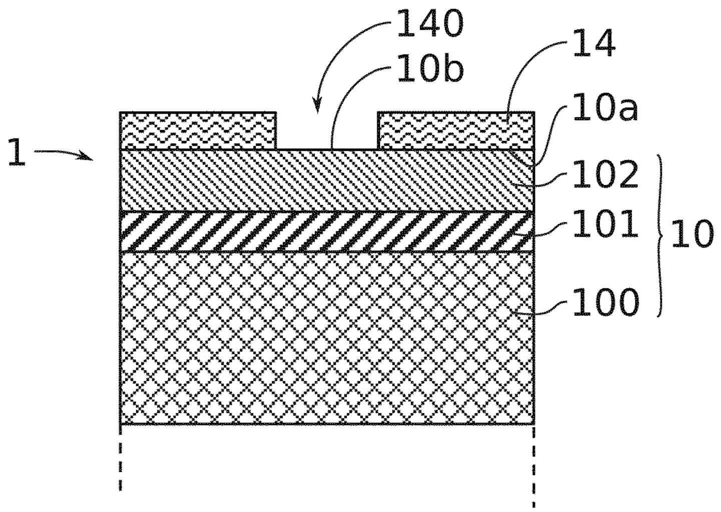
FIG. 3 illustrates a cross-sectional view of the substrate of FIG. 2 after the deposition of a mask.
Figure 6:
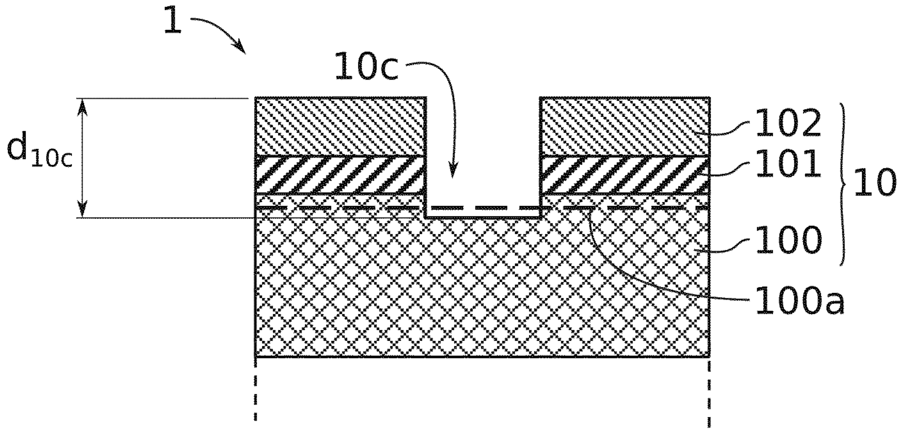
FIG. 6 illustrates a cross-sectional view of the substrate of FIG. 5B after removal of the mask.

According to an example which can be illustrated by FIG. 3, the mask 14 is deposited directly in contact with an upper face 10*a* of the layer 10. The mask 14 is, for example, formed by lithography of a layer deposited or transferred onto the layer 10. In some embodiments, the mask 14 is a hard mask. It is, for example, formed based on $Si_xN_y$, with x and y being non-zero integers. Examples of materials for forming the hard mask 14 include SiN, $Si_3N_4$, SiOCN, SiCBN and their derivatives, a photoresist, for example a carbon photoresist and a combination thereof. The mask 14 has opening(s) 140 as shown in FIG. 3. Each opening is delimited by lateral walls in line from which the portion 10*c* of the III-N layer 10 will be etched. The mask 14 can be lifted-off from the III-N layer 10 after the portion 10*c* of layer 10 is etched, as illustrated by FIG. 6.

Examples of Etching Cycle(s)

Figure 4:
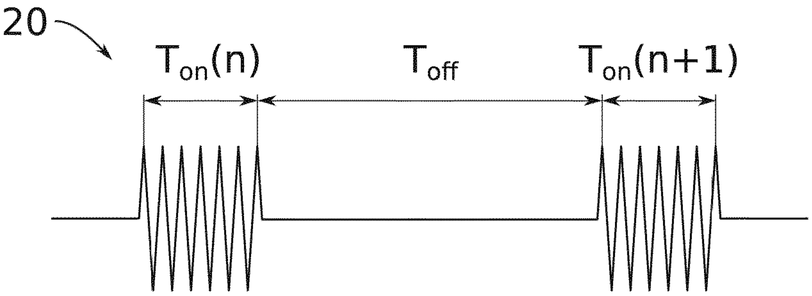
FIG. 4 illustrates the RF bias power of the plasma when the bias voltage Vbias-substrate is pulsed during the plasma treatment.
Figure 5A:
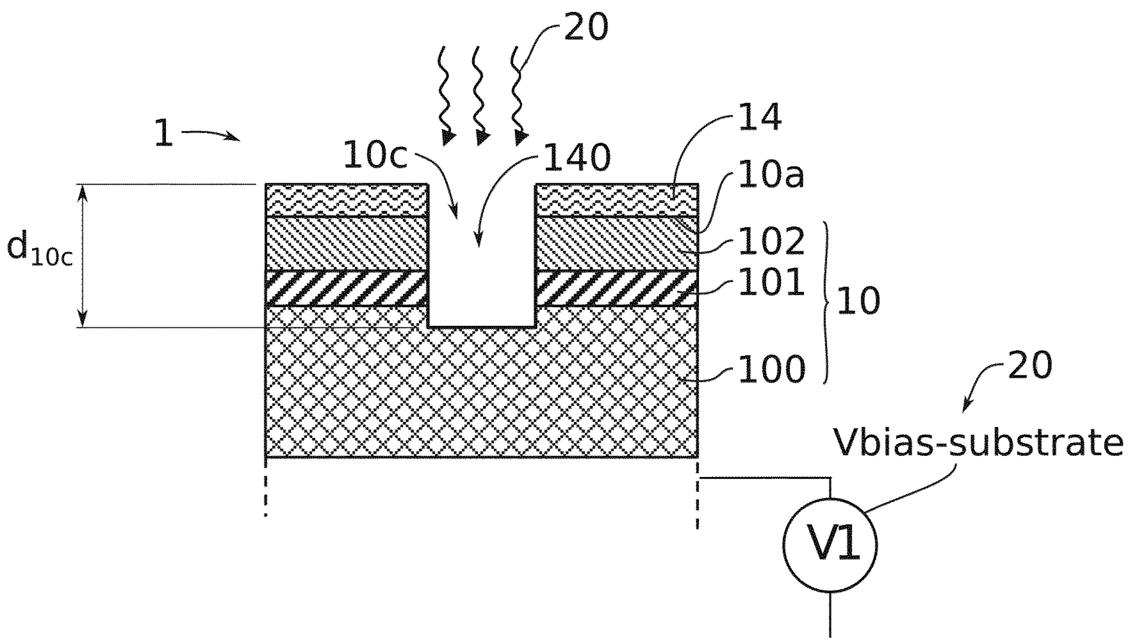
FIG. 5A illustrates a cross-sectional view of the substrate of FIG. 3 during an etching cycle, according to one example.

The method comprises at least one etching cycle as described below. During one etching cycle, one portion 10*b* (in some embodiments, several portions 10*b* of the upper face 10*a* of the III-N layer) is exposed to a plasma treatment with bias pulsing 20. During the plasma treatment, a non-zero polarization bias voltage (Vbias-substrate1) is applied to the substrate 1, as illustrated by FIGS. 4 and 5A.

The portion 10*b* of the upper face 10*a* is exposed to a plasma treatment with bias pulsing 20 from a gas mixture based on chlorine. According to one example, the gas mixture comprises boron trichloride ($BCl_3$) or chlorine ($Cl_2$). In some embodiments, boron trichloride ($BCl_3$) is mixed with chlorine ($Cl_2$). A chlorine-based plasma may be based on a chemistry comprising only one or several chemical specie(s) comprising the element CI and possibly one or more other species, for example one or more inert gases.

The plasma treatment with bias pulsing 20 can be obtained by intermittently, or periodically, operating the bias voltage applied to the substrate 1 Vbias-substrate1, so that an ion bombardment is performed on the exposed portion of the upper face. An example of the equipment that can be used will be described later in reference to FIG. 8. As illustrated in FIG. 4, in some embodiments, a bias voltage (Vbias-substrate1) is applied to substrate 1 during a plurality of times Ton, such as Ton(n) and Ton(n+1), where two consecutive times Ton(n) and Ton(n+1) being separated by a time Toff. In some embodiments, Toff can vary within an etching cycle. In some embodiments, Toff is constant for a given cycle and, in some cases, for every cycle. In some embodiments, successive Ton are constant for a given cycle, and in some cases, constant for every cycle.

It is possible to adjust the properties of the plasma treatment with bias pulsing 20, especially with the duty cycle DC=Ton/(Ton+Toff). In a duty cycle DC, Ton is a timeframe during which the bias voltage (Vbias-substrate1) is applied to the substrate 1 during a pulse period and Toff is a timeframe during the pulse period when the bias voltage (Vbias-substrate2) applied to the substrate is lesser than the bias voltage (Vbias-substrate 1) applied during Ton, in some instance the bias voltage during Toff is at a minimum value similar to Vplasma. Referring to FIG. 4, a pulse period equals to one iteration Ton and Toff. An etching cycle comprises several iteration Ton and Toff.

For example, DC 20% means that the ion bombardment is increased during 20% of pulse period, and decreased, and preferably deactivated, the rest of the pulse period. The dose received by the substrate is proportional to the duty cycle. The plasma potential Vplasma can be non-zero during essentially all the etching cycle(s). According to an example, the plasma power source is activated during essentially all the etching cycle(s).

During Ton, the bias voltage Vbias-substrate, called Vbias-substrate1, is applied to the substrate 1 so that the III-N layer is exposed to the ion bombardment. During Toff, the bias voltage Vbias-substrate, called Vbias-substrate2, is applied to the substrate 1 so that the III-N layer is less exposed to the ion bombardment than during Ton. For example, |Vbias-substrate2| is lesser than |Vbias-substrate1|, and preferably |Vbias-substrate2|≤0.5*|Vbias-substrate1|, and more preferably |Vbias-substrate2|≤0.2*|Vbias-substrate1|.

In some embodiments, during Ton, a non-zero bias voltage Vbias-substrate1 is applied to the substrate 1, with an absolute value |Vbias-substrate1| greater than or equal to 100V during at least a part of the etching cycle. In some embodiments the absolute value |Vbias-substrate1| is between 100V and 350V. A |Vbias-substrate1| greater than or equal to 100V allow increasing the ion bombardment during Ton and therefore the etching rate while limiting the damages thanks to the bias voltage pulsing.

During Toff, in some embodiments, no voltage bias is applied to the substrate, i.e. the Vbias-substrate2 is turned off or equal to zero. To this effect, the polarization device 312 (as described further below) can be deactivated during Toff. The ion bombardment is thus minimized. Preferably, |Vbias-substrate2|=0. During Toff, with a theoretical |Vbias-substrate 2|=0V, that is to say no Vbias-substrate is voluntarily applied to the substrate 1 by the polarization device 312 during Toff, a residual Vbias-substrate2 can still be applied to the substrate due to sheathing phenomenon in plasma. The voltage at the substrate 1 may be in this case similar to Vplasma. Under this condition, the ions in the chamber can still be energized, causing slight ion bombardment to the substrate 1, but the energy of the ions is significantly reduced because Vplasma is typically less than 20V. Plasma potential during Toff is then typically lesser than 20V, and more particularly roughly equal to 15V during Toff.

In the following, we consider, on a non-limitative basis, that no Vbias-substrate is applied to the substrate 1 during Toff. Further reference to Vbias-substrate concerns the bias voltage Vbias-substrate1 applied during Ton, unless specified otherwise.

Vbias-substrate can vary during one etching cycle (pulsing between Ton and Toff), for example Vbias-substrate may decrease along one etching cycle, or can remain constant. To have a |Vbias-substrate| greater than 100V, in some embodiment, |Vbias-substrate| is constant during Ton and greater than 100V during at least a part of the cycle. In some embodiments, the average of Vbias-substrate has an absolute value greater than 100V during at least a part of the cycle.

The plasma is operated partly with a plasma potential Vplasma, set by the plasma source 30. The plasma source 30 controls the plasma density and therefore the quantity of ions. When bias pulsing is activated, Vbias-substrate during Ton increases the energy of the ion during the ion bombardment of the exposed portion 10*b* of the upper face 10*a*. With increase voltage supplied by Vbias-substrate, the ions are more energized (comparing to the ion energy with only Vplasma), and therefore causing greater etch rate to the exposed portion 10*b* (i.e. the ions are traveling at a faster velocity towards the exposed portion 10*b* during Ton). The average energy of ion that impacts the exposed portion 10*b* is reduced because the ion bombardment is activated mainly and preferably only, during Ton. The average energy of ion bombardment is decreased, with limits the degradation of the etched layer. The degradation and the etching rate are proportional to Duty Cycle, and therefore to the time Ton during with the ion bombardment occurs on the exposed portion 10*b*. During Ton and Toff, the plasma density may remain constant and thus the number of ions striking the etched surface may remain constant. According to some embodiments, plasma treatment with bias pulsing enables increasing etch rate of the III-N layer compared to ALE compared to steady state etch at a high voltage (e.g., 150V-300V). Therefore, damages that could occur to the III-N layer is reduced significantly. Overall, the methods in the present disclosure reduce etching duration significantly for equivalent degradation levels of the etched layer, to obtain a satisfying quality of the III-N layer for the operation of the microelectronic device, such as a transistor or a diode, in which the substrate is integrated.

According to one example, the RF plasma source is also pulsed, i.e. the plasma source is operated intermittently. These pulsing can be synchronous. Pulsing both the plasma source and the Vbias-substrate gives the already mentioned advantages.

According to one example, the duty cycle is comprised between 10% and 80%, in some instances, between 20% and 70%, and in some instances, essentially equal to 50%. Adjustment of duty cycle percentages can improve the compromise between the quality of the III-N layer after etching and the time required to finish etching of the III-N layer.

According to one example, the etching cycle present a duration so that the etched portion 10*c* of the III-N layer 10 present a thickness $d_{10c}$ taken essentially perpendicularly to the main extension plan of the III-N layer, as illustrated by FIG. 5*a*. In some embodiments, the thickness $d_{10c}$ can be between 20 nm and 3 μm, especially when the substrate is implemented in a transistor, for example a HEMT. In some embodiments, the thickness $d_{10c}$ can be between 100 nm and 5 μm, when the substrate is implemented in a LED, for example a μm-LED. In some embodiments, only one etching cycle is needed to achieve the desired thickness for the portion 10*c*. In some embodiments, multiple etching cycles may be deployed to achieved the desired thickness. When multiple etching cycles are deployed, the total duration of the multiple cycles can be determined based on the desired etching thickness. Whether the method comprise one or multiple etching cycle(s), for the same etched thickness, embodiments of the present disclosure allow the number of cycles and the duration of the method to be greatly reduced compared to existing ALE techniques. Moreover, since the number of cycles is reduced (compare to existing ALE techniques), certain steps are eliminated, such as the reactor purging steps, which further reduces the total production time.

Non-limiting examples of parameters used in embodiments of the present disclosure will be described later.

Figure 5B:
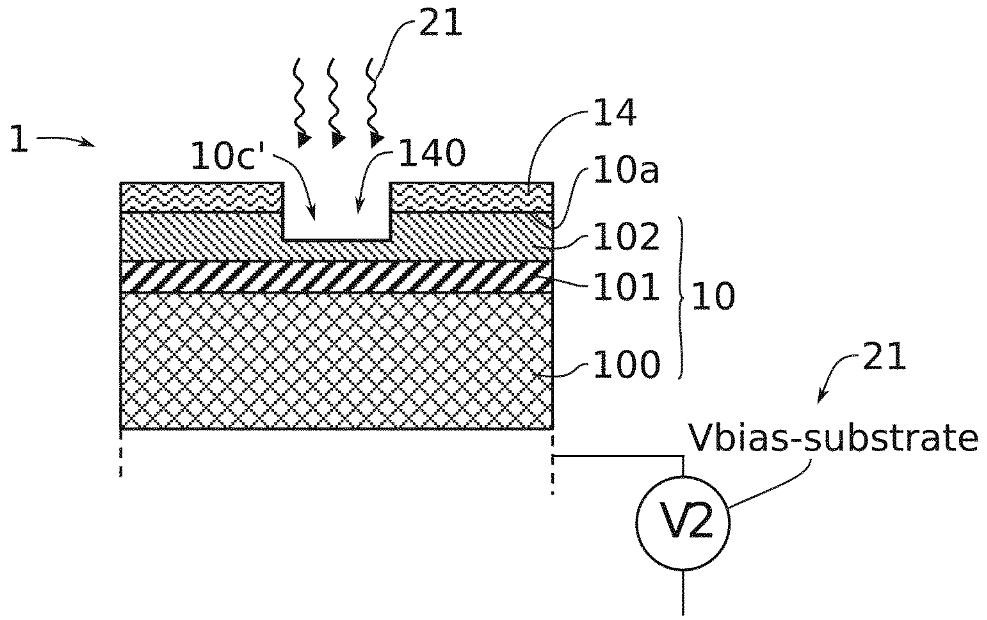
FIG. 5B illustrates a cross-sectional view of the substrate of FIG. 3 during an etching cycle, according to an alternative example or an example complementary to the one of FIG. 5A.

As illustrated for example by FIGS. 5B and 5A, successive etching cycles can be performed. In each cycle, the portion 10*b* of the upper face 10*a* can be exposed to a plasma treatment with bias pulsing 20 based on chlorine, while a bias voltage Vbias-substrate is applied to the substrate 1. Vbias-substrate V1, V2 can vary between the cycles, and preferably between each cycle. The ion energy can thus be adapted (or changed) between different cycles. In some embodiments, Vbias-substrate of at least one etching cycle is strictly less than Vbias-substrate of one preceding etching cycle. In some embodiments, Vbias-substrate of successive etching cycles are progressively decreasing. For example, if V2 of FIG. 5B is followed by V1 of FIG. 5A, V1 can be lower than V2 (i.e. V2>V1), and so forth. Each Vbias-substrate can be strictly less than Vbias-substrate applied within a preceding etching cycle. Vbias-substrate may be reduced in each subsequent cycle. This would allow faster etching rate in the beginning, but also more bombardment, and finer etching precision with less bombardment at the end. The damage induced on the III-N layer can hence be limited as one gets to the desired etching level. Vbias-substrate can be less than or equal to 100V during at least some cycles of the plurality of cycles, especially for the last cycles.

Each etching cycle is for example performed in an etching reactor, for example an inductively-coupled plasma (ICP) reactor, as described later. The ICP reactor can be a reactive ion etching (RIE) ICP reactor.

In some embodiments, each of the steps in the cycle is performed in the same etching reactor. This reduces the number of steps and reduces the overall process time. In addition, it avoids the need to remove the layer 10 from the equipment, which would lead to a higher risk of contamination.

Non-limiting examples of parameters used for embodiments of the present disclosure will be described later.

Additional Prior Etching Step

Figure 5C:
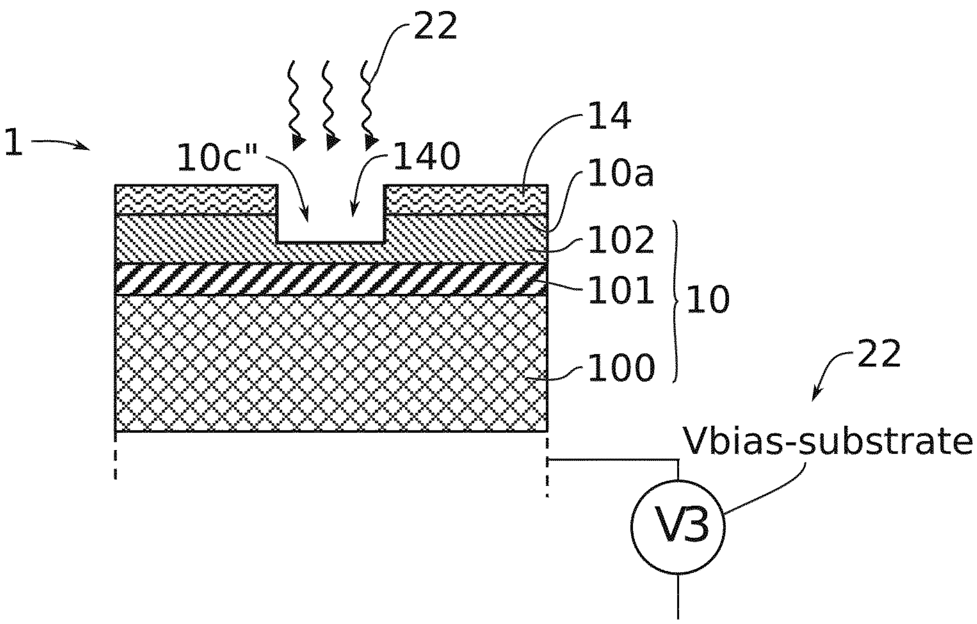
FIG. 5C illustrates a cross-sectional view of the substrate of FIG. 3 during an etching prior to the etching cycle illustrated in FIG. 5A.

According to an example illustrated by FIG. 5C, the method comprises, prior to the etching cycle as described above, a prior etching step wherein the portion 10*b* of the upper face 10*a* is exposed to a plasma 22 treatment based on chlorine. A non-zero and non-pulsed Vbias-substrate V3 may be applied to the substrate 1 during the plasma 22 treatment. In some embodiments, Vbias-substrate V3 can be essentially equal to or different than the Vbias-substrate of the following etching cycle(s). For example, Vbias-substrate V3 during the prior etching is greater than the Vbias-substrate of the following etching cycle(s). In some embodiments, Vbias-substrate V3 during the prior etching is greater than or equal to 100V during at least a part of the prior etching cycle. A plasma treatment with a non-pulsed bias is faster than a plasma treatment with a pulsed bias, but more damaging for the etched layer. A prior plasma treatment with a non-pulsed bias is particularly useful to etch a thick portion the III-N layer, where a fast first etching step can be used to etch the majority of the layer, and the etching can be finalized by limiting the damages on the III-N layer.

This prior etching step can be an alternative or complementary to the successive etching cycles as described above. For example two successive etching cycle can be performed with Vbias-substrate V1=200V and V2=90V with a plasma treatment with a bias pulsing for each. Two successive etching cycles can be performed with a non-pulsed plasma wherein Vbias-substrate V1=200V, and a plasma treatment with a bias pulsing wherein Vbias-substrate V2=90V.

Example of Following Steps after the Prior Etching Cycle(s)

FIG. 6 illustrates the result after the etching cycle through the mask 14, after mask 14 removal. The portion 10*c* of the III-N layer 10 is etched to a thickness $d_{10c}$ from the upper face 10*a*.

The etched portion 10*c* forms an opening in the III-N layer 10 that may then be filled, for example with one or more materials, to form functional portions of a microelectronic device.

Figure 7:
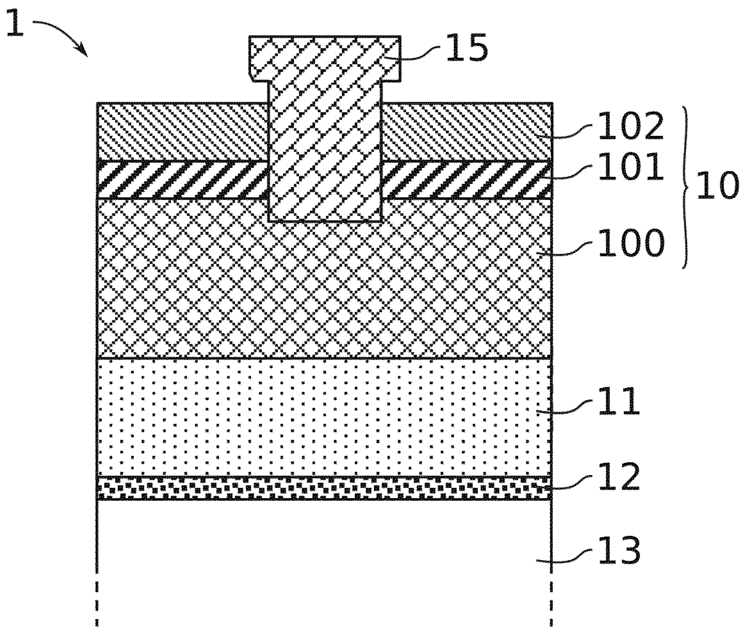
FIG. 7 illustrates a cross-sectional view of a microelectronic device obtained after filling the etched opening in the III-N layer as illustrated by FIGS. 5A and 5B.

As illustrated in FIG. 7, the etched portion 10*c* may be filled with an electrically conductive material to form an electrical contact, for example a grid 15. Other etched portion, such as shallower etched portion extending only through layers 101 and 102, non-represented in the figures, may be filled to form a source and a drain. In this example, layer 100 forms the active layer of a transistor.

Of course, a multitude of other microelectronic devices can be formed from etching portions 10*c* of the III-N layer 10, such as a LED and more particularly a LED emitting in the μm wavelength range (μm-LED).

Example of Equipment

Figure 8:
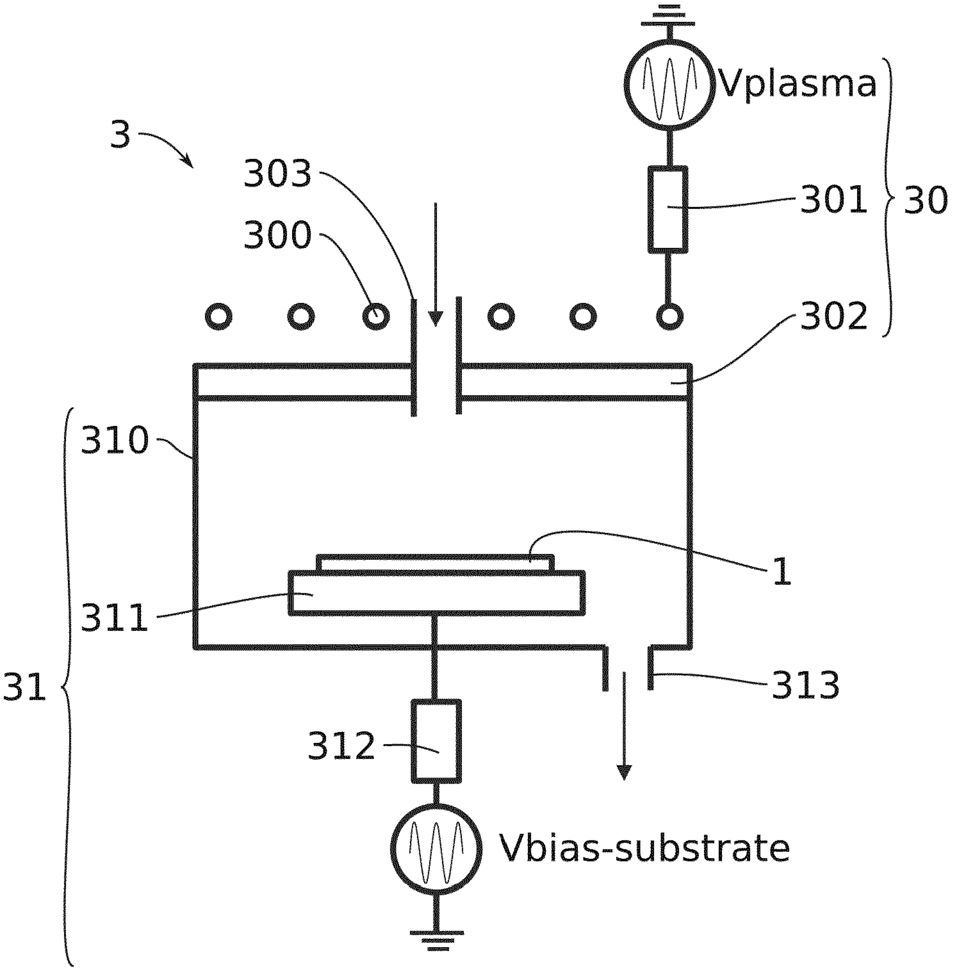
FIG. 8 illustrates a schematic view of an example of reactor.

FIG. 8 illustrates an exemplary ICP plasma reactor 3 that can be used to implement embodiments of the present disclosure.

According to one example, the reactor 3 includes a plasma source 30. The plasma potential Vplasma can be set by a power source 301 coupled with a coil 300 or antenna placed in the exterior of the chamber 31. Typically, an alternating current flows through the coil 300, which induces a magnetic field inside the chamber 31 where the gas mixture is injected through a duct 303, as represented by the arrow on top of the reactor. The variations in this magnetic flux inductively generate an RF electric field, thus creating the electromagnetic field responsible for the initiation and maintenance of the plasma in the chamber 31. The plasma density and the dissociation coefficient are typically controlled by the RF power injected in the coil. In an ICP reactor, the plasma potential Vplasma is offset from the substrate 1. The plasma is ignited below the quartz window 302 by the planar coils 300 above the window 302.

The reaction chamber 31 may comprises an interior delimited by outer walls 310, in which the substrate 1 is placed.

The reaction chamber 31 may include a sample holder 311, which can also be called tray. The substrate 1 can rest on the sample holder 311 by a rear surface. The front surface of the substrate 1 is exposed to the species present in the reaction chamber 31. The tray 311 is preferentially electrically conductive. The reactor 3 also includes a pump 313 to control the pressure within the reaction chamber 31 synergistically with the flow rate of the injected gases, and extract the species present in the reaction chamber 31.

Advantageously, this reactor 3 includes a polarization device 312 configured to apply the polarization bias voltage Vbias-substrate to the tray 311, for example via a radio frequency power generator. This voltage can ultimately be applied to the substrate 1, at least to its face facing the plate 311, whether this face is electrically conductive or not. This polarization device 312 is distinct from the plasma source 30, and more particularly from the plasma power source 301. Vbias-substrate increases the ion energy at the substrate 1. In the absence of Vbias-substrate, for zero voltage, the ion energy is similar to Vplasma. The efficiency of ion bombardment on the III-N layer 10 can thus be better controlled than with a non-remote plasma source 30 or a remote source that is not associated with the application of a Vbias-substrate, for example, by a substrate polarization device 312. In addition, the use of a remote source 30 avoids direct contact between the plasma in its formation zone and the substrate 1, which could damage the substrate 1. The use of an offset plasma source also minimizes the directivity of the plasma treatment. The processing of a three-dimensional structure, especially a nanostructure, can be facilitated.

The polarization device 312 and the plasma power source 301 are configured to apply Vbias-substrate to the tray 311 independently from the plasma potential Vplasma. Vbias-substrate and Vplasma are independent. Vbias-substrate and Vplasma are independently controlled. The polarization device 312 is therefore different from an impedance matching unit that may be associated with the sample holder 311.

Examples of Experimental Parameters

Non-limiting examples of parameters used for the etching cycle are now described. In some embodiments, the same or similar parameters can apply for a prior etching with a plasma treatment with a non-pulsed bias, apart from the frequency which does not apply for a plasma treatment with a non-pulsed bias. In some embodiments, the plasma treatment with bias pulsing 20 is configured to present a pulse frequency F=1/(Ton+Toff), where F can be between 100 Hz and 1 kHz, and in some cases, between 150 Hz and 1 kHz. For example, the pulse frequency can be set by the polarization device or bias RF generator 312.

In some embodiments, the power of the source can be essentially comprised between 100 W and 2000 W, in some implementations, between 300 W to 1000 W.

In some embodiments, the flow rate of the gas species can be in a range of 30 sccm to 1500 sccm. In some implementations, the flow rate can be between 50 sccm and 500 sccm.

In some embodiments, the injected gas species can be $Cl_2$ in combination with $BCl_3$. Preferably the injected quantity of $Cl_2$ is greater than the injected quantity of $BCl_3$. For example $Cl_2$ flow rate is greater than $BCl_3$ flow rate. Equivalently, the gas mixture intended to form the plasma comprises a greater amount of $Cl_2$ than of $BCl_3$. In some embodiments, the ratio between $Cl_2$ and $BCl_3$ may vary such as 100% $Cl_2$ and 0% $BCl_3$ or 0% $Cl_2$ and 100% $BCl_3$. In some embodiments, the injected gas species can be diluted with a neutral gas such as Ar or He. In some embodiments, the injected gas species can be diluted with other reactive gases such as $N_2$ and $O_2$.

In some embodiments, the pressure in the reaction chamber 31 can be comprised essentially between 2 mTorr and 250 mTorr, in some instances, between 5 mTorr and 90 mTorr, in some instances between 5 mTorr and 20 mTorr, with 1 Torr=1=mmHg≈133,322 Pa. In some embodiments, the pressure in the reaction chamber 31 can be adjusted as a function of the injected gas flow rate and the aspiration by the pump 313.

In some embodiments, the wafer temperature of the reaction chamber 31 can comprised essentially between 20° C. and 80° C., in some instances, between 30° C. and 60° C. The temperature of the reaction chamber can be the temperature of the walls 310, and/or the temperature of the sample holder 311.

In some embodiments, Vbias-substrate, in absolute value, is comprised essentially between 20V and 800V. In some instances, between 20V and 350V, in some instances between 100V and 500V, in some instances between 150V and 350V. This parameter determines mainly the energy of each ion during a plasma treatment with bias pulsing.

The duration of an etch cycle can be adapted according to the desired thickness to be etched.

Optionally, a stabilization step can be implemented before any plasma treatment step, e.g., before each plasma treatment, in order to stabilize the gases, pressure and temperature. This stabilization phase can be implemented for a duration of several seconds.

Examples of Materials

For example, as illustrated in FIG. 2, the III-N layer 10 comprises a plurality of layers each based on a III-N material. In this non-limiting example, the layer 10 comprises, successively disposed from a support 13, a layer 100 of GaN, a layer 101 of AlN, and a layer 102 of AlGaN. According to another embodiment, the layer 10 can comprise, successively disposed from a support 13, a layer 100 of GaN and a layer 102 of AlGaN without an intermediate layer of AlN.

In some embodiments, a buffer layer 11 can be disposed between the layer 10 and the support 13, as illustrated for instance in FIG. 2.

An oxide layer, non-represented, can surmount layer 10 in some embodiments. For example, the oxide layer may be placed in direct contact with the upper face 10*a*.

Non-Limitative Embodiments and Characterization by Rsheet Measurement

Standard electrical characterization techniques (Van Der Pauw and Transmission Line Method) require adequate structures and therefore require a lithography process. In order to characterize the etched III-N layer 10 after etching without requiring cumulating long and expensive steps, the four-point method is used to characterize the layer resistance Rsheet of III-N layers without any lithography step. Layer resistance, also known as Rsheet is expressed in Q/u, also denoted Q/sq. The layer resistance is measured, for example, by the well-known four-point 4 method. An example of this well-known method is, for example, described in patent application EP3023799A1 published on May 25, 2016 and listing as inventors C. Leroux and J. LEHMANN.

Typically, this electrical characterization can be used to evaluate the electrical degradation induced by the different etching processes, in particular in this context after the etching of the III-N layer 10. An example of a four-point method is now described.

Figure 9A:
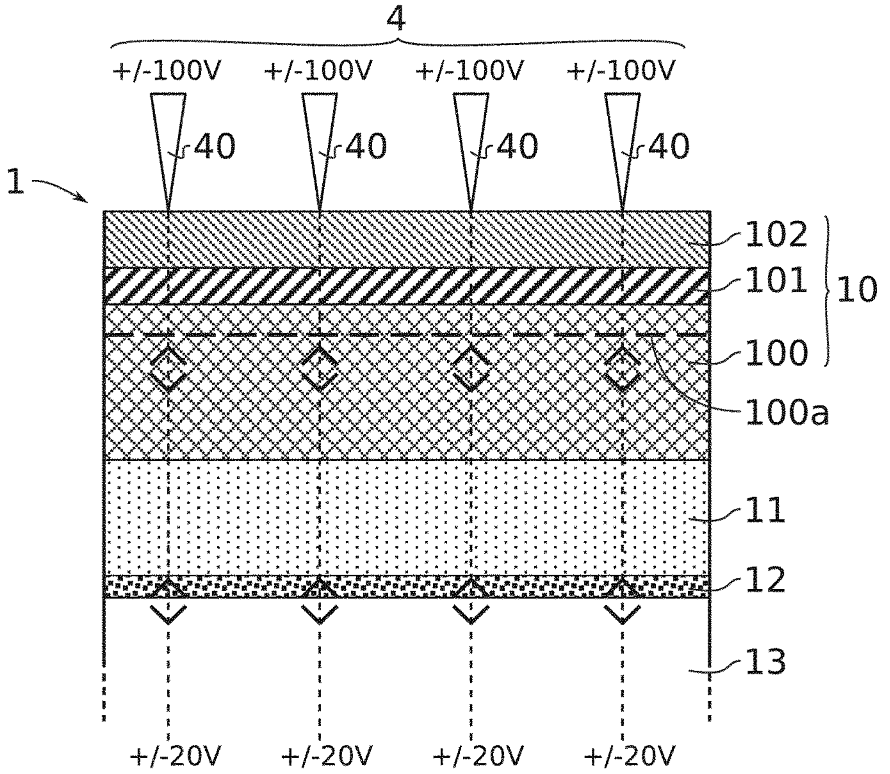
FIGS. 9A and 9B illustrate a measurement of Rsheet according to an example.
Figure 9B:
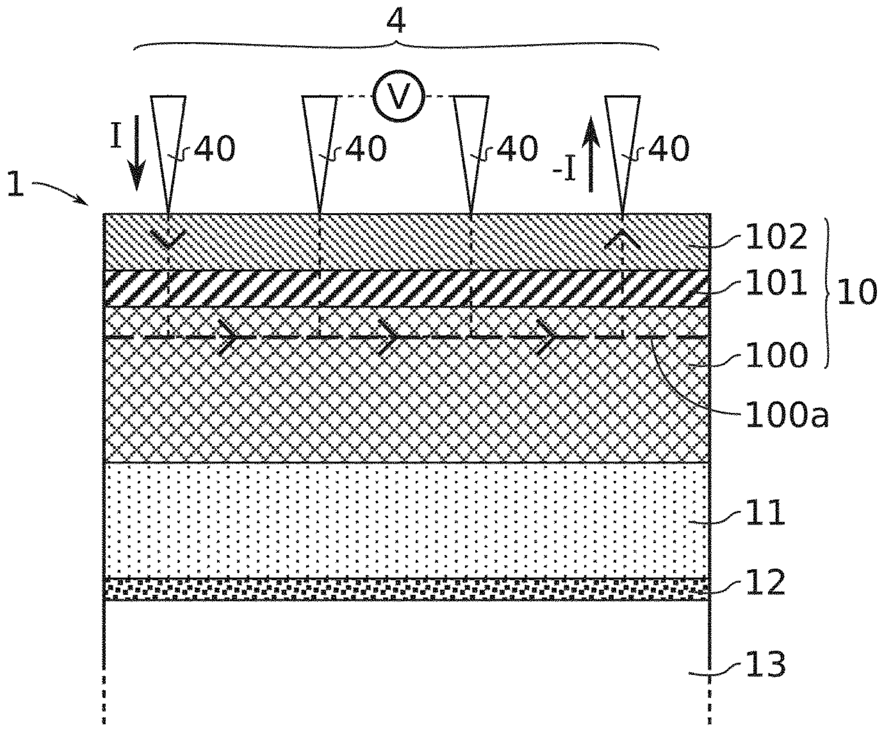

According to certain embodiments, the measurement takes place in two steps, as illustrated by FIGS. 9A and 9B. After placing four metal tips 40 so that they are aligned and equidistant, for example at a distance inferior to 1 mm from one another, an electrical is created with the 2 dimensional electron gas 100*a* of the III-N layer 10, hereafter denoted 2DEG. To do so, a stack shorting is performed between each tip 40 and the substrate 1. Tip after tip, a voltage of 120V is applied between the tip 40 and the substrate 1, as illustrated in FIG. 9A. It induces a vertical shorting, along a direction essentially perpendicular to the main extension plan of the III-N layer. The vertical shorting contacts the 2DEG which extends along a plane essentially parallel to the main extension plane of the III-N layer. Once the contacts with the 2DEG are made, the measurement can be performed. As illustrated in FIG. 9B, a current I of the order of a milliampere is applied to the tip 40 number 1 and comes out, crossing the 2DEG, by the tip 40 number 4 which is connected to the ground. The tips 2 and 3 are used to measure the voltage V of the 2DEG during the passage of the current I.

The determination of Rsheet in square, i.e. the resistance in 2DEG, is made possible by applying the following equation, obtained by making the assumptions of a collinear measurement on a semi-infinite thin film:

$$Rsheet = \frac{V}{I}.F$$

Where V is the measured voltage, I is the applied current and F is a form factor. In the thin film configuration, the form factor is given by $$\frac{\pi}{\ln(2)}.$$

For example, the equipment used to perform this measurement is a SUMMIT 1200 semi-automatic probe system from CASCADE Microtech[ ], operating with a 4156C parameter analyzer from Agilent. An HP Basic program allows the automation of the shortings and measurements.

Before each series of measurements, the equipment is preferably tested on a reference plate with a known Rsheet to determine the measurement deviation. If the deviation is too large, the positioning of the tips and their condition are checked until the Rsheet measurement is accepted. The standard deviation of the measurement is in the order of a few %.

Some embodiments are now described as non-limiting examples. Substrates as illustrated in FIG. 2 and described above were etched according to different conditions detailed in the following samples:

50: exposed to a continuous plasma treatment (also may be referred as steady state etching) based on $Cl_2/BCl_3$ with a ratio 1:1, with the application a non-pulsed Vbias-substrate of 237 V;

51: exposed to a plasma treatment with bias pulsing based on $Cl_2/BCl_3$ with a ratio 1:1, with F=200 Hz and DC=20%, with the application a Vbias-substrate of 237 V; 20)

52: exposed to a plasma treatment with bias pulsing based on $Cl_2/BCl_3$ with a ratio 1:1, with F=200 Hz and DC=50%, with the application a Vbias-substrate of 237 V;

53: exposed to a plasma treatment with bias pulsing treatment based on $Cl_2/BCl_3$ with a ratio 1:1, with F=200 Hz and DC=90%, with the application a Vbias-substrate of 237 V;

54: exposed to 42 cycles of ALE. During the chlorination phase of each ALE cycle, the plasma is composed of $Cl_2/BCl_3$ with a ratio 19:1 and no applied bias RF. During the ion bombardment phase of the ALE cycles, the plasma is composed of Argon with an applied bias voltage of 50 V to sputter the chlorinated material.

Figure 10:
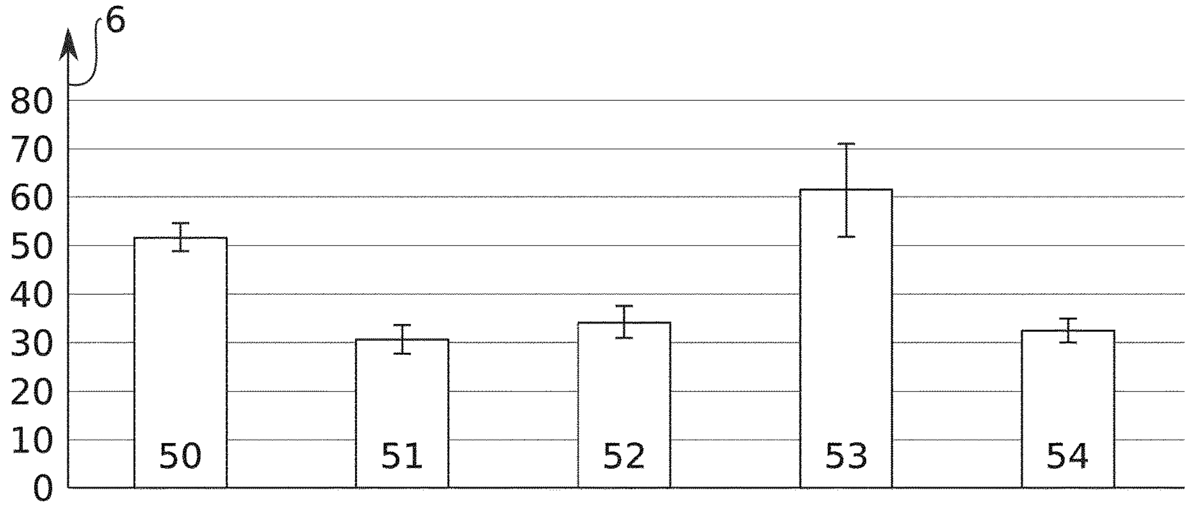
FIG. 10 is a diagram of Rsheet measurements.

Rsheet measurements 6 for these samples are represented in FIG. 10, relatively to a non-etched substrate, according to the following:

$$\text{Relative } Rsheet(\%) = \frac{Rsheet(\text{etched sample}) - Rsheet(\text{unetched substrate})}{Rsheet(\text{unetched substrate})} \times 100$$

Relative Rsheet, etching rate and duration of the method to etch 70 nm of the III-N layer are summarized in the table below.

| Sample | Relative Rsheet (%) | Etching rate (nm/min) | Duration for a 70 nm etching |
|---|---|---|---|
| 50 | 52 | 182.4 | 23 s |
| 51 | 31 | 46.4 | 90 s |
| 52 | 34 | 103.8 | 40 s |
| 53 | 61 | 164.6 | 25 s |
| 54 | 32 | 0.7 | 10 min (without stabilization steps) |

FIG. 10 and the above table show the advantages of etching with a plasma treatment with Vbias-substrate bias pulsing. A continuous plasma treatment 50 (steady state, high voltage etching) induces a Rsheet of 52%, whereas an ALE etching (sample 54) limits the damages with a Rsheet of only 32%. However, the ALE etching presents a very long duration which is not compatible with industrial standard of less than 2 minutes for the etching step. As shown in the table above, similar Rsheet value was achieved using plasma treatment with bias pulsing (e.g., comparing sample 54 to sample 52). Etching the III-N layer with bias pulsing using an application of a Vbias-substrate, with DC=50% achieved a degradation of the III-N layer similar to the one obtained with an ALE etching, with much shorter durations (40 s) for the same etching thickness (70 nm).

The above table also represents the etching rate of each sample to etch 70 nm of GaN. As shown in samples 51, 52, 53, the etching duration remains less than 2 min, which is compatible with industrial processes. In contrast, the ALE method takes 10 min for etching 70 nm (or even 20 min if we take into account the total stabilization steps between each step of the ALE cycles).

The present invention is not limited to the above described examples. Many other embodiments are possible, for example by combination of previously described features, without going beyond the scope of the present disclosure. Furthermore, the features described in relation to one aspect of the invention may be combined with another aspect of the invention.

For example, in the preceding examples, the upper layer is based on GaN. Nevertheless, the present invention also extends to embodiments in which the upper layer is a layer based on other III-N material. The III-N material based layer may comprise at least one from the group consisting of indium, gallium and aluminum. For example, this III-N layer may be GaN, AlGaN, AlN, InGaN, or AlInGaN. Thus, all of the above-mentioned examples, features, steps and technical advantages with reference to a GaN-based layer are applicable to a structure based on any of the III-N materials.

Furthermore, in the examples described above the structure is a layer. Nevertheless, all the examples, features, steps and technical advantages mentioned above with reference to a structure forming a layer are applicable to a structure not forming a layer but forming a point structure, for example a three-dimensional relief. The structure may be a nanostructure or comprise a plurality of nanostructures. The second layer may be a nanostructure or comprise a plurality of nanostructures.

The invention claimed is:

1. A method for etching at least a portion of a layer based on a III-N material, comprising:

providing a substrate comprising at least one III-N layer based on a III-N material, presenting an upper face, and performing at least one etching cycle comprising exposing at least one portion of the upper face to a plasma treatment based on chlorine with a plasma potential, wherein the plasma treatment comprises bias voltage pulsing and is configured to present a duty cycle DC=Ton/(Ton+Toff) comprised between 10% and 80%, wherein:

during at least a part of Ton timeframes, a first non-zero bias voltage called Vbias-substrate1 is applied to the substrate, wherein the first Vbias-substrate1 has an absolute value |Vbias-substrate1| greater than or equal to 100V, during Toff timeframes, a second bias voltage called Vbias-substrate2 is applied to the substrate, wherein the Vbias-substrate2 has an absolute value |Vbias-substrate2| less than |Vbias-substrate1|, or no bias voltage is applied to the substrate, and Vbias-substrate1 and Vbias-substrate2 being independent from the plasma potential, so as to etch the portion of the III-N layer extending from the portion of the upper face.

2. The method according to claim 1, wherein |Vbias-substrate1| is comprised between 100V and 800V during at least a part of Ton timeframes.

3. The method according to claim 1, wherein |Vbias-substrate1|>2*|Vbias-substrate2|, during at least a part of Ton timeframes.

4. The method according to claim 1, wherein the duty cycle is comprised between 20% and 70%.

5. The method according to claim 1, wherein the at least one etching cycle presents a duration so that the etched portion of the at least one III-N layer presents a thickness comprised between 20 nm and 3 μm.

6. The method according to claim 1, wherein the plasma treatment with bias pulsing is configured to present a frequency F=1/(Ton+Toff) comprised between 100 Hz and 5 kHz.

7. The method according to claim 1, comprising performing multiple etching cycles, wherein |Vbias-substrate1| is different between the etching cycles.

8. The method according to claim 7, wherein |Vbias-substrate1| is less than or equal to 100V during at least some cycles of the multiple cycles.

9. The method according to claim 1, wherein the method comprises, prior to the at least one etching cycle, a prior etching cycle of the portion of the III-N layer comprising:

exposing the least one portion of the upper face (10*a*) to a plasma treatment based on chlorine with the plasma potential, and during the plasma treatment, applying a non-zero and non-pulsed bias voltage Vbias-substrate to the substrate, Vbias-substrate being independent from Vplasma.

10. The method according to claim 1, wherein prior to the at least one etching cycle, the upper face of the III-N layer is covered by a mask.

11. The method according to claim 1, wherein the plasma treatment with bias pulsing treatment is performed in a reaction chamber, and a pressure inside the reaction chamber is comprised between 2 mTorr and 250 mTorr during the at least one etching cycle.

12. The method according to claim 1, wherein the plasma treatment with bias pulsing treatment is performed in a reaction chamber, a temperature of the reaction chamber is comprised between 20° C. and 80° C. during the at least one etching cycle.

13. The method according to claim 1, wherein the plasma treatment with bias pulsing treatment is based on $Cl_2$.

14. The method according to claim 1, wherein the III-N material comprises a chemical element selected from the group consisting of aluminum and gallium.

15. The method according to claim 1, wherein the substrate is integrated into a transistor for power electronic.

16. The method according to claim 1, wherein the substrate is integrated into a light emitting diode.

17. The method according to claim 1, wherein |Vbias-substrate 1|>5*|Vbias-substrate2|, during at least a part of Ton timeframes.

18. The method according to claim 1, wherein the plasma treatment with bias pulsing treatment is based on $Cl_2$ in combination with $BCl_3$.

19. The method according to claim 1, wherein the III-N material comprises a chemical element selected from the group consisting of AlGaN, GaN, AlN, InGaN, AlInGaN.

20. The method according to claim 1, wherein the substrate is integrated into a HEMT transistor.

* * * * *